United States Patent
Wen et al.

(10) Patent No.: US 9,330,902 B1
(45) Date of Patent: May 3, 2016

(54) METHOD FOR FORMING HFOX FILM BASED ON ATOMIC LAYER DEPOSITION (ALD) PROCESS

(71) Applicant: United Microelectronics Corp., Hsinchu (TW)

(72) Inventors: Tsai-Yu Wen, Tainan (TW); Shih-Cheng Chen, Tainan (TW); Shan Ye, Kaohsiung (TW); Tsuo-Wen Lu, Kaohsiung (TW); Yu-Ren Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/731,227

(22) Filed: Jun. 4, 2015

(51) Int. Cl.
- *H01L 21/3205* (2006.01)
- *H01L 21/02* (2006.01)
- *H01L 29/66* (2006.01)
- *H01L 29/51* (2006.01)
- *H01L 21/28* (2006.01)

(52) U.S. Cl.
CPC ...... *H01L 21/02181* (2013.01); *H01L 21/0228* (2013.01); *H01L 21/28194* (2013.01); *H01L 29/517* (2013.01); *H01L 29/66545* (2013.01)

(58) Field of Classification Search
CPC .......................... H01L 29/513; H01L 29/517
USPC .............................................. 257/4; 438/591
See application file for complete search history.

(56) References Cited

U.S. PATENT DOCUMENTS

| | | | |
|---|---|---|---|
| 7,794,787 B2 | 9/2010 | Sarigiannis et al. | |
| 8,282,992 B2 | 10/2012 | Myo et al. | |
| 2003/0106490 A1* | 6/2003 | Jallepally | C23C 16/45521 117/89 |
| 2005/0045092 A1* | 3/2005 | Wu | C30B 25/02 117/92 |
| 2005/0189598 A1* | 9/2005 | Jang | H01L 27/105 257/400 |
| 2010/0258782 A1* | 10/2010 | Kuse | H01L 45/1616 257/4 |
| 2014/0198575 A1* | 7/2014 | Dutta | G11C 16/3418 365/185.17 |

* cited by examiner

*Primary Examiner* — Jami M Valentine
(74) *Attorney, Agent, or Firm* — J.C. Patents

(57) ABSTRACT

A method for forming a HfOx film based on atomic layer deposition (ALD) process includes: providing a substrate; dividing a plurality of ALD cycles as needed into multiple depositing stages, wherein each of the ALD cycles includes applying $HfCl_4$ pulse and applying $H_2O$ pulse over the substrate and a content ratio of $HfCl_4$ to $H_2O$ is different and increasing for the depositing stages; and performing the depositing stages to form a HfOx film.

13 Claims, 5 Drawing Sheets

முறை FOR FORMING HFOX FILM
BASED ON ATOMIC LAYER DEPOSITION
(ALD) PROCESS

BACKGROUND OF THE INVENTION

1. Field of Invention

The present invention relates to a semiconductor process, and more particularly to a method for forming HfOx film based on atomic layer deposition (ALD) process.

2. Description of Related Art

MOS is a basic structure widely applied to various semiconductor devices, such as memory devices, image sensors and display devices. An electric device is required to be made lighter, thinner and smaller, in which that MOS transistor needs to be scaled down accordingly. In order to assure the function of MOS transistor is in well performance, a rather thin layer of high-K material, such as HfOx film, is used to serve as a gate insulating layer in the transistor.

The traditional manner to form the HfOx film is based on ALD process, in which each ALD cycle just forms a layer with the thickness of atomic order, such as 0.5 or 0.6 Angstroms. After a number of ALD cycles, an intended thickness of the HfOx film can be formed.

FIG. 1 is a drawing, schematically illustrating a traditional apparatus form forming the HFOx film. In FIG. 1, the traditional apparatus may include a holder 52, which can hold a substrate 54, such as silicon substrate. The substrate 54 is located inside a chamber 50. The chamber has an inlet and outlet, so the material of $H_2O$ and $HfCl_4$ can be applied through the chamber 50 by a form of pulses. Due to the reaction between $H_2O$ and $HfCl_4$, the HfOx film can be formed. Here, the index x of HfOx ideally is 2. However, the index x for this stage of formation is usually not exactly equal to 2, as usually known in the art.

FIG. 2 is a drawing, schematically illustrating a traditional ALD cycles to form the HFOx. For one ALD cycle, a $H_2O$ pulse with pulse time oft may be applied in to the chamber 50 and then a $HfCl_4$ pulse with pulse time oft may be applied after the $H_2O$ pulse. The material of $HfCl_4$ may react with the $H_2O$ staying on the substrate, so an atomic layer of HfOx can be formed. After a certain number of ALD cycles, the HfOx film with intended thickness can be formed.

SUMMARY OF THE INVENTION

The present invention provides a method for forming HfOx film based on ALD process, in which a ratio of Hf to O in the HfOx film can be in better uniformity with respect to the depth of the HfOx film.

The present invention provides a method for forming a HfOx film based on ALD process comprising: providing a substrate; dividing a plurality of ALD cycles as needed into multiple depositing stages, wherein each of the ALD cycles comprises applying $HfCl_4$ pulse and applying $H_2O$ pulse over the substrate and a content ratio of $HfCl_4$ to $H_2O$ is different and increasing for the depositing stages; and performing the depositing stages to form a HfOx film.

According to an embodiment of the present invention, the substrate is silicon substrate.

According to an embodiment of the present invention, a range of the content ratio of $HfCl_4$ to $H_2O$ for a first stage of the depositing stages is 0.1 to 2.

According to an embodiment of the present invention, a range of the content ratio of $HfCl_4$ to $H_2O$ for a second stage of the depositing stages is 0.2 to 2.

According to an embodiment of the present invention, a range of the content ratio of $HfCl_4$ to $H_2O$ for a third stage of the depositing stages is 0.3 to 2.

According to an embodiment of the present invention, a range of the content ratio of $HfCl_4$ to $H_2O$ for a fourth stage of the depositing stages is 0.4 to 2 and a range of the content ratio of $HfCl_4$ to $H_2O$ for a fifth stage of the depositing stages is 0.5 to 2.

According to an embodiment of the present invention, the method further comprises: performing at least a subsequent processing step over the HfOx film to increase a dielectric constant of the HfOx film; and forming a metal gate over the HfOx film.

According to an embodiment of the present invention, in the step of applying the $H_2O$ pulse, $O_2$ and $O_3$ are involved.

According to an embodiment of the present invention, each of the ALD cycle over the substrate comprises: the step of applying $H_2O$ pulse, with a first pulse time; purging $H_2O$; the step of applying $HfCl_4$ pulse, with a second pulse time; purging $HfCl_4$, wherein a ratio of the second pulse time to the first pulse time is accordingly changed with respect to the depositing stages.

According to an embodiment of the present invention, additional steps of applying $H_2O$ pulse and purging $H_2O$ are performed after the depositing stages.

According to an embodiment of the present invention, a gate structure can be formed on the HfOx film.

According to an embodiment of the present invention, the step of forming the gate structure comprises foil ing a dummy gate stack and further comprises performing a metal gate replacement process for replacing the dummy gate stack with a metal gate structure.

In view of the above, the HfOx film can be formed in multiple stages with different ratio of $HfCl_4$ to $H_2O$ and can have better uniformity of the Hf/O ratio with respect to the depth of the HfOx film.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
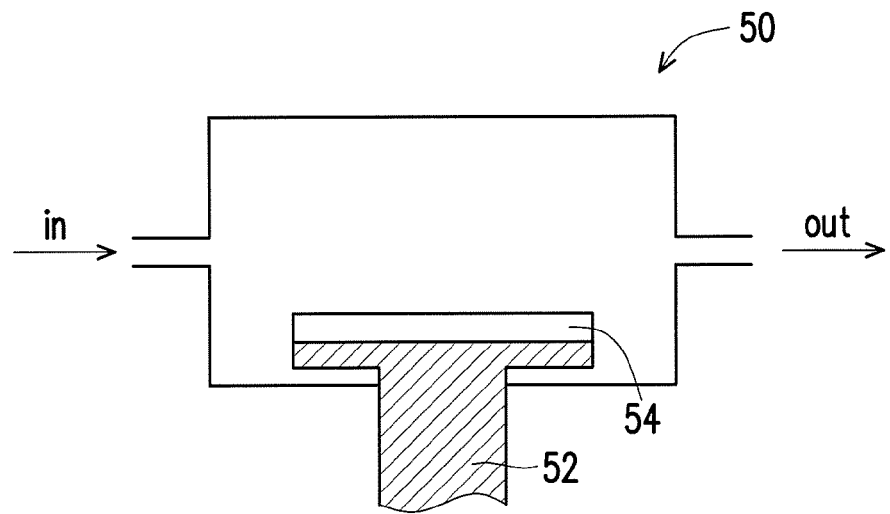
FIG. 1 is a drawing, schematically illustrating a traditional apparatus form forming the HfOx film.
Figure 2:
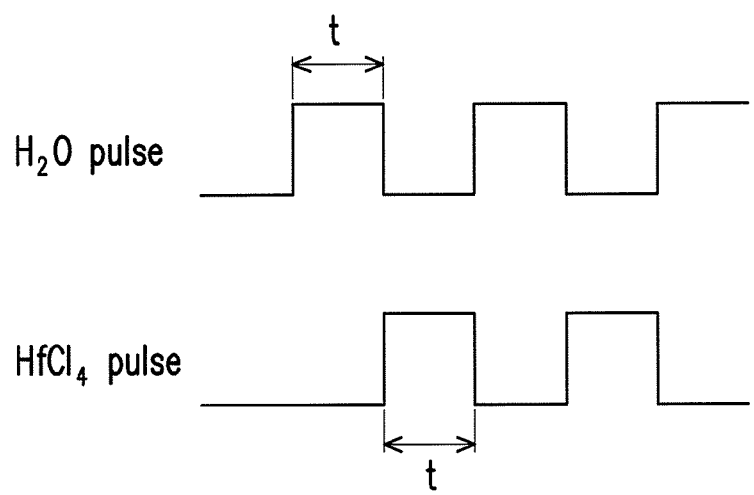
FIG. 2 is a drawing, schematically illustrating a traditional ALD cycles to form the HFOx.

Reference will now be made in detail to the present preferred embodiments of the invention, examples of which are illustrated in the accompanying drawings. Wherever possible, the same reference numbers are used in the drawings and the description to refer to the same or like parts.

The HfOx film has high dielectric constant (K) and can be used to serve as the gate insulating layer, which is required to be thin for the MOS transistor with reduced size. The HfOx film can be formed based on ALD process, in which the thickness is determined by the number of ALD cycles being applied.

Usually, after the HfOx film is preliminarily formed, the index x of the chemical form is not exactly equal to 2 as $HfO_2$. So, at least a subsequent processing step over the HfOx film would be performed to increase the dielectric constant of the HfOx film. For example, N atoms are subsequently applied to the HfOx. However, if the Hf/O ration in the HfOx film is varying with the depth, then the result could be not good as expected because a uniform concentration of the N atoms are usually applied within the whole HfOx film.

The present invention has investigated the ratio of Hf/O in the HfOx film with respect to the depth. Indeed, the ratio of Hf/O in the HfOx film is varying with the depth. The present invention proposes that the HfOx film is formed by the ALD cycles in at least two stages, in which a content ratio of $HfCl_4$ to $H_2O$ is different and increasing for the depositing stages.

Several embodiments are provided to describe the present invention, but the present invention is not limited to the provided embodiments.

Figure 3:
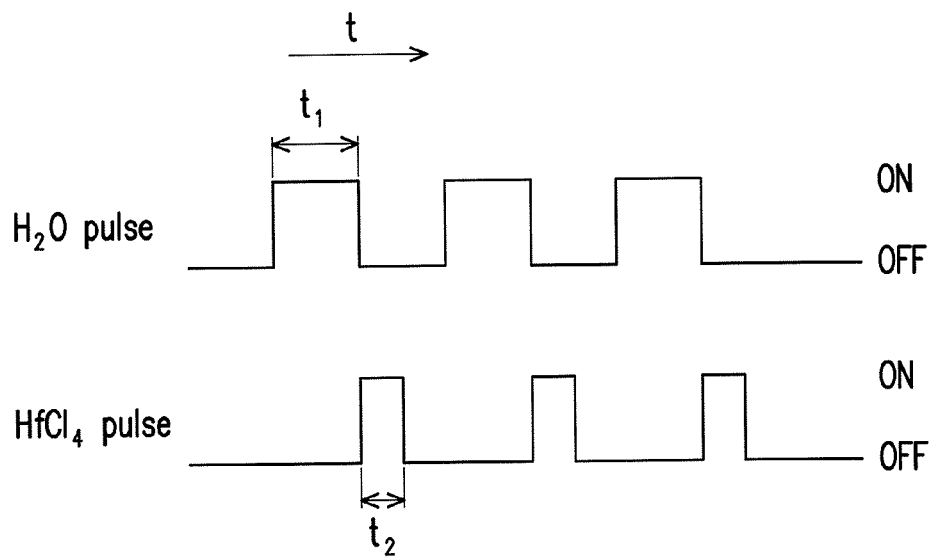
FIG. 3 is a drawing, schematically illustrating a mechanism for applying the $H_2O$ pulses and the $HfCl_4$ pulses within ALD cycles, according to an embodiment of the present invention.

FIG. 3 is a drawing, schematically illustrating a mechanism for applying the $H_2O$ pulses and the $HfCl_4$ pulses within ALD cycles, according to an embodiment of the present invention. In FIG. 3, the $H_2O$ pulses are applied to the apparatus as for example shown in FIG. 1, over the substrate 54, such as silicon substrate. The pulse time in time is t1. The pulse time can also be referred as pulse width. In alternate time periods not apply the $H_2O$ pulses, the $HfCl_4$ pulses are applied to the apparatus, in which the pulse time of the $HfCl_4$ pulses in time is t2. The ratio of the t2 to t1 is not always a constant but different and increasing with respect to the depositing stages.

Here, the concentrations of the $H_2O$ and $HfCl_4$ in the each pulse with respect to time is the same as in an embodiment, so the ratio of $HfCl_4$ to $H_2O$ can be determined by the ratio of t2 to t1. However, if concentrations of the $H_2O$ and $HfCl_4$ in the pulses are different, the pulse time t1 or t2 would be accordingly adjusted to assure the ratio of $HfCl_4$ to $H_2O$ is achieved as given.

Figure 4:
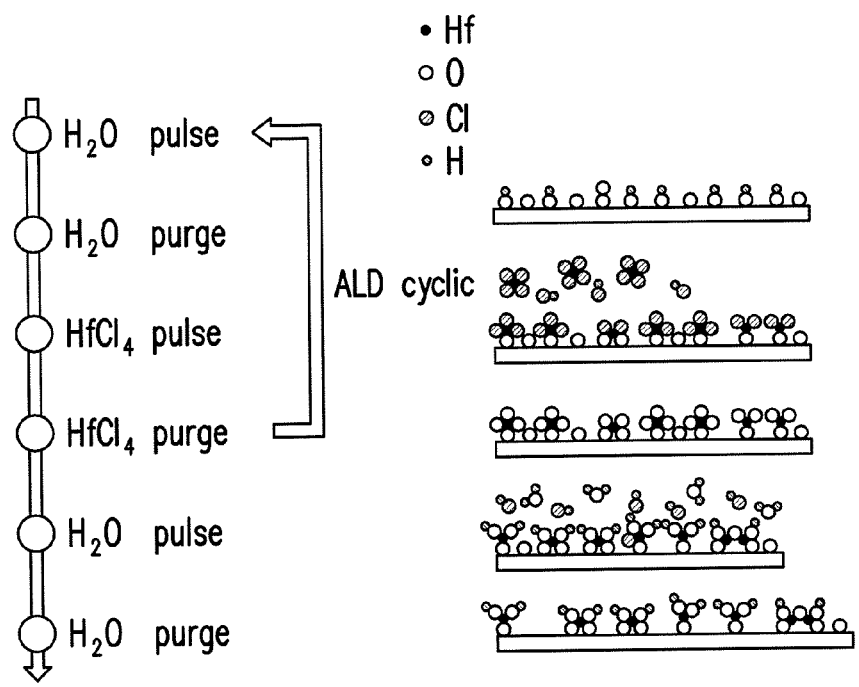
FIG. 4 is a drawing, schematically illustrating a mechanism for ALD cycle of $H_2O$ pulses and $HfCl_4$ pulses to form the atomic layer of HfOx, according to an embodiment of the present invention.

Further, the mechanism of ALD cycle for the HfOx film is described. FIG. 4 is a drawing, schematically illustrating a mechanism for ALD cycles of $H_2O$ pulses and $HfCl_4$ pulses to form the atomic layer of HfOx, according to an embodiment of the present invention.

In FIG. 4, one ALD cycle may contribute a thickness, such as about 0.5, 06 Angstroms in an example, for the HfOx film. In an example, one ALD cycle may include applying $H_2O$ pulse, with a first pulse time; purging $H_2O$; applying $HfCl_4$ pulse, with a second pulse time; and purging $HfCl_4$. A ratio of the second pulse time to the first pulse time is accordingly changed with respect to the depositing stages.

When applying $H_2O$ pulse over the substrate, the $H_2O$ molecules would adhere to the substrate. Then, the $H_2O$ is purged to leave a monolayer of $H_2O$. When applying the $HfCl_4$ pulse, the molecules of $HfCl_4$ would react with $H_2O$ molecules. After purging the $HfCl_4$, a monolayer of the ALD layer after reaction is formed. At this stage, one ALD cycle is done and form the monolayer with a thickness, such as one Angstrom, or alternatively 0.5-0.6 Angstroms. So, an intended thickness of the HfOx film usually needs a certain number of ALD cycles. After the HfOx film with the intended thickness is formed by the ALD cycles, additional $H_2O$ pulse may be applied again at the end stage to remove chlorine and the $H_2O$ purging step is applied also.

Figure 5:
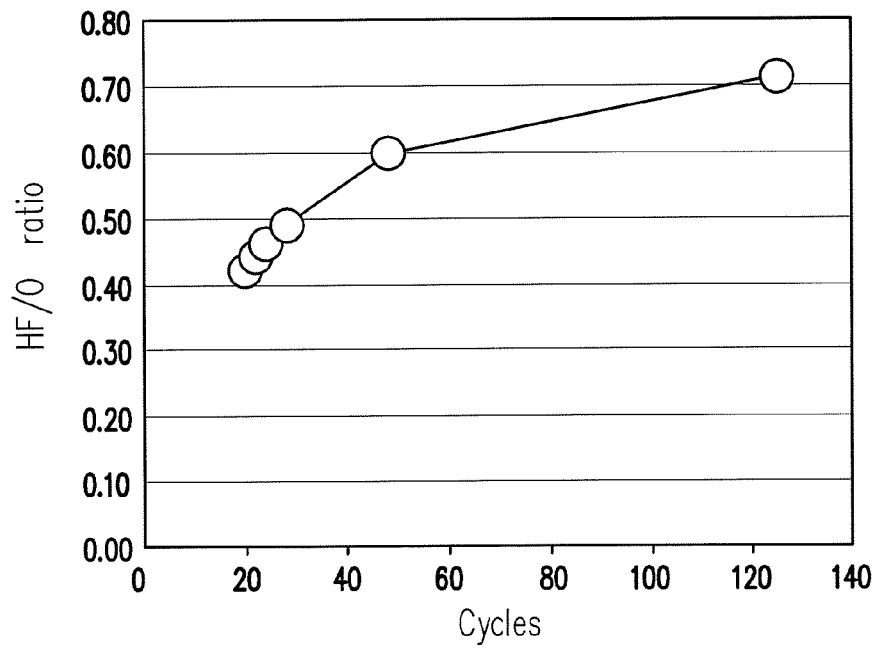
FIG. 5 is a drawing, schematically illustrating a ratio of Hf to O in the HfOx film with respect to the number of ALD cycles applied, according to an embodiment of the present invention.

Before describing the control of the content ratio of $HfCl_4$ to $H_2O$, the present invention have investigated the ratio of Hf to O in the HfOx film with respect to the depth. FIG. 5 is a drawing, schematically illustrating a ratio of Hf to O in the HfOx film with respect to the number of ALD cycles applied, according to an embodiment of the present invention.

In FIG. 5, taking a constant ratio for Hf to O, such as about 0.6, the number of ALD cycles being applied would indicate the depth of the HfOx film in physical property. The data as investigated by the present invention shows that the Hf/O ratio is not a constant and increasing with the number of the ALD cycles. This implies that the later ALD cycle, or the shallow portion of the HfOx film, has less O content, resulting in higher ratio of Hf/O.

Figure 6:
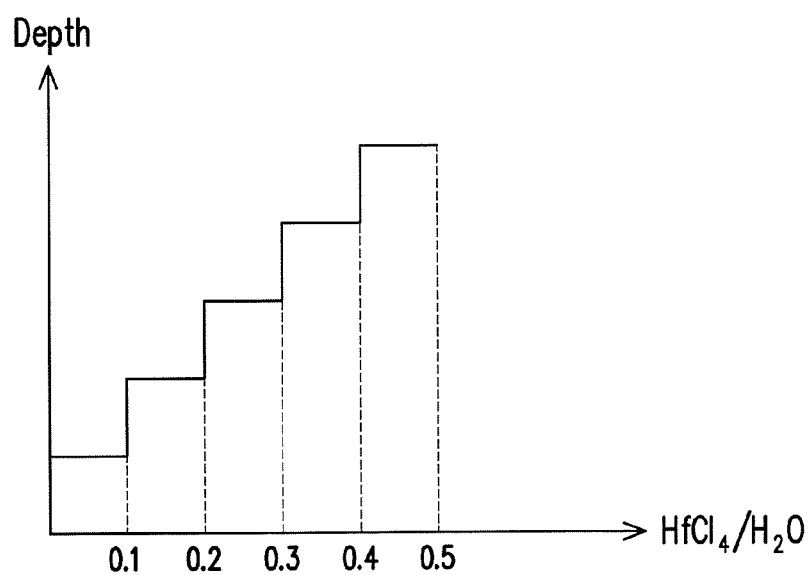
FIG. 6 is a drawing, schematically illustrating the changes of the ratios of $HfCl_4$ pulses to $H_2O$ pulses in different stages, according to an embodiment of the present invention.

The present invention proposes that content ratio of $HfCl_4$ to $H_2O$ for the ALD cycles are not kept constant but increasing instead. Under the aspect, the present invention proposes that the ALD cycles as needed to have the intended thickness can be divided into at least two depositing stages, in which the content ratio of $HfCl_4$ to $H_2O$ is increasing. FIG. 6 is a drawing, schematically illustrating the changes of the ratios of $HfCl_4$ pulses to $H_2O$ pulses in different stages, according to an embodiment of the present invention.

To form the HfOx film, it usually needs a large number of ALD cycles. In practical strategy, the ALD cycles can be divided into multiple depositing stages. In an example, five depositing stages as an example is provided for describing the present invention. Each depositing stage includes multiple ALD cycles, such as 5-10 cycles. However, depending on the intended thickness of the whole HfOx film, the number of depositing stages can be 3 stages, 2-5 stages or even more.

In the example, the content ratio of $HfCl_4$ to $H_2O$ for the first depositing stage can be in a range of 0.1 to 2. The content ratio in the example is 0.1. The first depositing stage contributes a part of the intended thickness, which is at the bottom portion of the HfOx film. The second depositing stage has the content ratio of $HfCl_4$ to $H_2O$ in a range of 0.2 to 2 as an example, and is the greater than that in the first depositing stage. The content ratio in the example is 0.2. Likewise, the third depositing stage has the content ratio of $HfCl_4$ to $H_2O$ in a range of 0.3 to 2 as an example, and is the greater than that in the second depositing stage. The content ratio in the example is 0.3. The fourth depositing stage has the content ratio of $HfCl_4$ to $H_2O$ in a range of 0.4 to 2 as an example, and is the greater than that in the third depositing stage. The content ratio in the example is 0.4. The fifth depositing stage has the content ratio of $HfCl_4$ to $H_2O$ in a range of 0.5 to 2 as an example, and is the greater than that in the fourth depositing stage. The content ratio in the example is 0.5.

Due to the effect as shown in FIG. 5, the later depositing stage has larger O content or less Hf content. This ratio of Hf to O in the HfOx film may approach to a better uniformity in all depth, about remaining at the beginning level of the first depositing stage.

Further, the HfOx film belongs to a dielectric material having high dielectric constant, so HfOx film is also a good candidate for serving as the gate insulating layer in the MOS transistor. An example in application for forming a metal gate of transistor is described as follows.

Figure 7A:
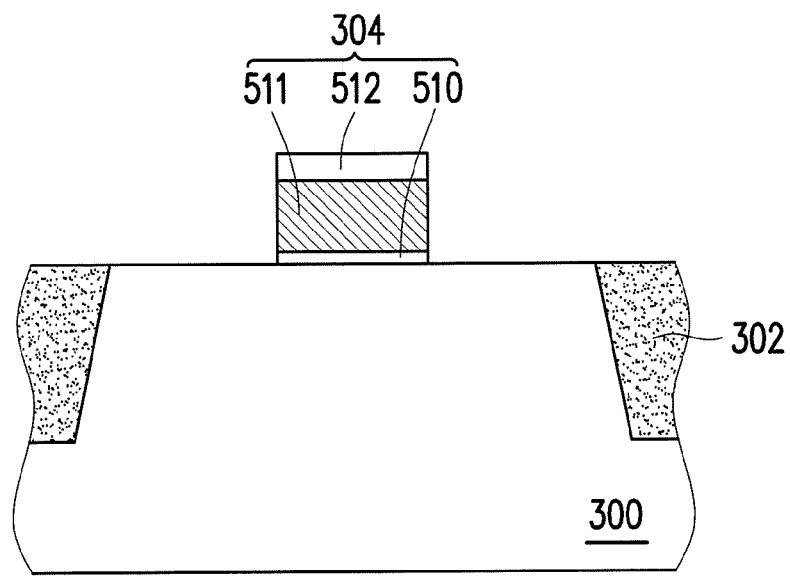
FIGS. 7A-7D are drawings, schematically illustrating a process for forming a metal gate on the HfOx film, according to an embodiment of the present invention.
Figure 7B:
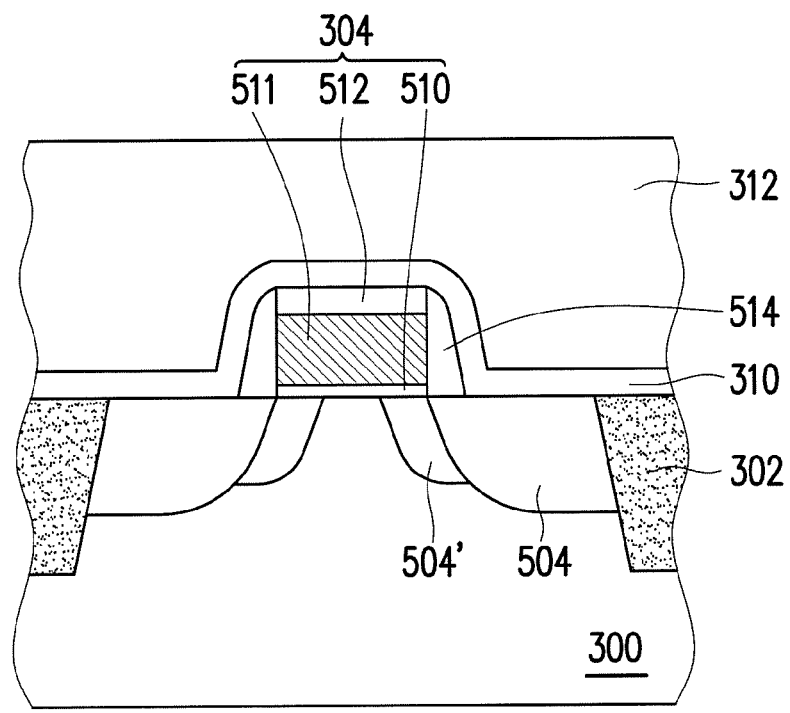

FIGS. 7A-7D are drawings, schematically illustrating a process for forming a metal gate on the HfOx film, according to an embodiment of the present invention. In FIG. 7A, a substrate 300 is provided. The substrate 300 is silicon substrate in an example. Isolation structures 302 are formed in the substrate 300 to define a device region. A HfOx layer 510, serving as a high-K layer, is formed on the substrate 300 based on ALD process as previously described. The HfOx layer 510 can be performed with further subsequent process to increase the dielectric constant, such as applying N atoms into the HfOx layer 510. A dummy gate 511, such as polysilicon gate, is staked on the HfOx layer 510. A cap layer 512 is formed on the dummy gate 511. The dummy gate structure 304 is then formed from the HfOx layer 510, the dummy gate 511 and the cap layer 512 in the example.

In 7B, a spacer 514 is formed on sidewalls of the dummy gate structure 304. The lightly doped region 504' and heavily doped region 504 are also formed in the substrate 300. A contact etch stop layer 310 is formed over the substrate 300. An inter-layer dielectric (ILD) layer 312 is formed on the contact etch stop layer 310.

Figure 7C:
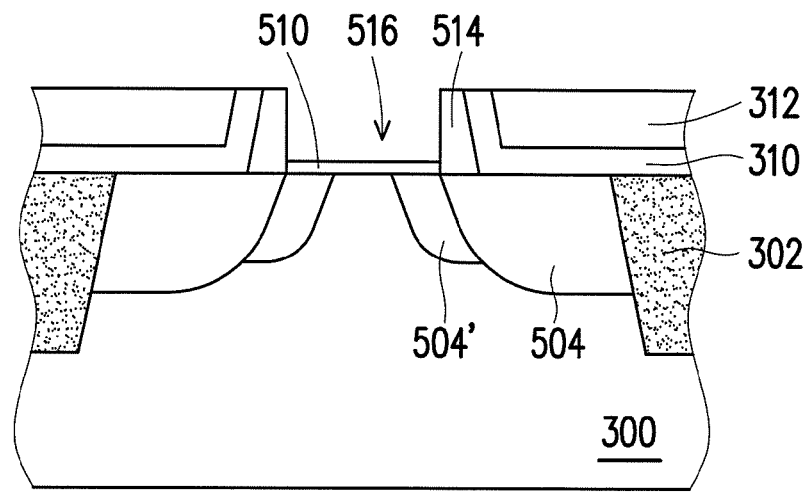

In FIG. 7C, a chemical mechanical polishing process in an example is performed to polish the ILD layer 312, the contact etch stop layer 310, the spacer 514 and the cap layer 512, until the dummy gate 511 is exposed. Then, the dummy gate 511 of polysilicon material is etched away to expose the HfOx layer 510 and the spacer 514. Then, a space 516, originally occupied by the dummy gate 511, is formed.

Figure 7D:
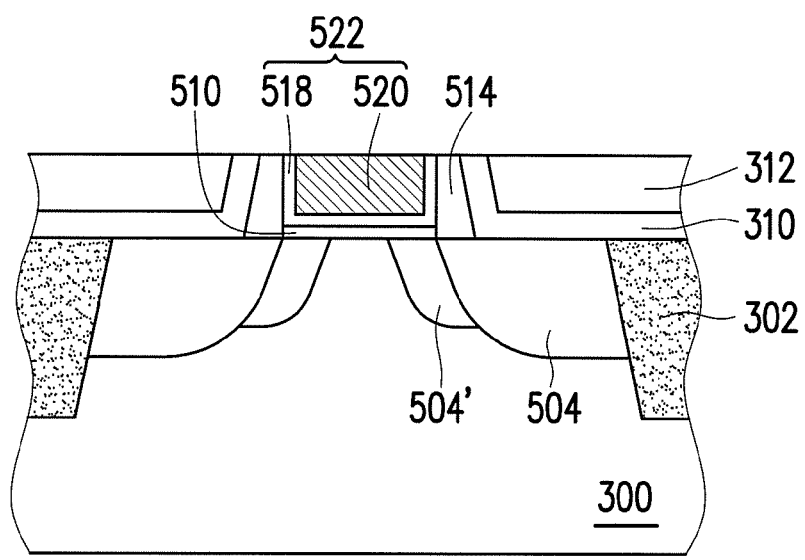

In FIG. 7D, a work function metal layer 518 is formed over the substrate 300, being conformal to the surface structure at top. A low resistance metal layer 520 is formed over the work function metal layer 518 and fully fills into the space 516. Another polishing process is performed again until the ILD layer 312 is exposed. The metal gate 522 is formed, including the work function metal layer 518 and the low resistance metal layer 520 in the example. The processes in FIGS. 7A-7D can be generally referred as a metal gate replacement process.

The metal gate 522 is indeed formed on the HfOx layer 510, which is formed by the method of the present invention. The gate current leak can be reduced and gate reliability can be improved.

The present invention has proposed the method for forming a HfOx film based ALD process includes: providing a substrate; dividing a plurality of ALD cycles as needed into multiple depositing stages, wherein each of the ALD cycles includes applying $HfCl_4$ pulse and applying $H_2O$ pulse over the substrate and a content ratio of $HfCl_4$ to $H_2O$ is different and increasing for the depositing stages; and performing the depositing stages to form a HfOx film.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for forming a HfOx film based on atomic layer deposition (ALD) process, comprising:
   providing a substrate;
   dividing a plurality of ALD cycles as needed into multiple depositing stages, wherein each of the ALD cycles comprises applying $HfCl_4$ pulse and applying $H_2O$ pulse over the substrate and a content ratio of $HfCl_4$ to $H_2O$ is different and increasing for the depositing stages; and
   performing the depositing stages to form a HfOx film.

2. The method of claim 1, wherein the substrate is silicon substrate.

3. The method of claim 1, wherein a range of the content ratio of $HfCl_4$ to $H_2O$ for a first stage of the depositing stages is 0.1 to 2.

4. The method of claim 3, wherein a range of the content ratio of $HfCl_4$ to $H_2O$ for a second stage of the depositing stages is 0.2 to 2, a range of the content ratio of $HfCl_4$ to $H_2O$ for a third stage of the depositing stages is 0.3 to 2.

5. The method of claim 4, wherein a range of the content ratio of $HfCl_4$ to $H_2O$ for a third stage of the depositing stages is 0.3 to 2.

6. The method of claim 5, wherein a range of the content ratio of $HfCl_4$ to $H_2O$ for a fourth stage of the depositing stages is 0.4 to 2 and a range of the content ratio of $HfCl_4$ to $H_2O$ for a fifth stage of the depositing stages is 0.5 to 2.

7. The method of claim 1, further comprising:
   performing at least a subsequent processing step over the HfOx film to increase a dielectric constant of the HfOx film; and
   forming a metal gate over the HfOx film.

8. The method of claim 1, wherein in the step of applying the $H_2O$ pulse, $O_2$ and $O_3$ are involved.

9. The method of claim 1, wherein each of the ALD cycle over the substrate comprises:
   the step of applying $H_2O$ pulse, with a first pulse time;
   purging $H_2O$;
   the step of applying $HfCl_4$ pulse, with a second pulse time;
   purging $HfCl_4$,
   wherein a ratio of the second pulse time to the first pulse time is accordingly changed with respect to the depositing stages.

10. The method of claim 9, wherein additional steps of applying $H_2O$ pulse and purging $H_2O$ are performed after the depositing stages.

11. The method of claim 1, wherein the x in HfOx is in a range between 0.8 and 1.7.

12. The method of claim 1, further comprising forming a gate structure on the HfOx film.

13. The method of claim 12, wherein the step of forming the gate structure comprises:
   forming a dummy gate stack on the HfOx film; and
   performing a metal gate replacement process to replace the dummy gate stack with a metal gate structure.

* * * * *